United States Patent
Chen et al.

(10) Patent No.: US 7,394,692 B2
(45) Date of Patent: *Jul. 1, 2008

(54) NON-VOLATILE SEMICONDUCTOR MEMORY WITH LARGE ERASE BLOCKS STORING CYCLE COUNTS

(75) Inventors: Jian Chen, San Jose, CA (US); Tomoharu Tanaka, Tokyo (JP)

(73) Assignees: Sandisk Corporation, Milpitas, CA (US); Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/419,696

(22) Filed: May 22, 2006

(65) Prior Publication Data

US 2006/0206770 A1 Sep. 14, 2006

Related U.S. Application Data

(60) Continuation of application No. 11/003,046, filed on Dec. 2, 2004, now Pat. No. 7,085,161, which is a division of application No. 10/353,574, filed on Jan. 28, 2003, now Pat. No. 6,944,063.

(51) Int. Cl.
*G11C 11/34* (2006.01)
*G11C 7/10* (2006.01)
*G11C 8/00* (2006.01)

(52) U.S. Cl. .............................. 365/185.11; 365/185.17; 365/185.24; 365/185.28; 365/185.29; 365/185.33; 365/189.011; 365/230.03

(58) Field of Classification Search ............ 365/185.17, 365/185.18, 185.19, 185.24, 185.28, 185.29, 365/189.01, 230.03
See application file for complete search history.

(56) References Cited

U.S. PATENT DOCUMENTS

4,622,656 A 11/1986 Kamiya et al.

(Continued)

FOREIGN PATENT DOCUMENTS

EP 0589597 3/1994

(Continued)

OTHER PUBLICATIONS

Kamiya et al., "EPROM Cell with High Gate Injection Efficiency," IEDM Technical Digest, Dec. 1982, pp. 741-744.

(Continued)

*Primary Examiner*—Ly D Pham
(74) *Attorney, Agent, or Firm*—Davis Wright Tremaine LLP

(57) ABSTRACT

In a flash EEPROM system that is divided into separately erasable blocks of memory cells with multiple pages of user data being stored in each block, a count of the number of erase cycles that each block has endured is stored in one location within the block, such as in spare cells of only one page or distributed among header regions of multiple pages. The page or pages containing the block cycle count are initially read from each block that is being erased, the cycle count temporarily stored, the block erased and an updated cycle count is then written back into the block location. User data is then programmed into individual pages of the block as necessary. The user data is preferably stored in more than two states per memory cell storage element, in which case the cycle count can be stored in binary in a manner to speed up the erase process and reduce disturbing effects on the erased state that writing the updated cycle count can cause. An error correction code calculated from the cycle count may be stored with it, thereby allowing validation of the stored cycle count.

6 Claims, 3 Drawing Sheets

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,268,870 A | 12/1993 | Harari | |
| 5,291,440 A * | 3/1994 | Koyama | 365/185.17 |
| 5,297,148 A | 3/1994 | Harari et al. | |
| 5,313,421 A | 5/1994 | Guterman et al. | |
| 5,315,541 A | 5/1994 | Harari et al. | |
| 5,343,063 A | 8/1994 | Yuan et al. | |
| 5,438,573 A | 8/1995 | Mangan et al. | |
| 5,485,595 A | 1/1996 | Assar et al. | |
| 5,570,315 A | 10/1996 | Tanaka et al. | |
| 5,619,448 A * | 4/1997 | Lin | 365/185.03 |
| 5,661,053 A | 8/1997 | Yuan | |
| 5,712,180 A | 1/1998 | Guterman et al. | |
| 5,751,634 A * | 5/1998 | Itoh | 365/185.17 |
| 5,774,397 A | 6/1998 | Endoh et al. | |
| 5,822,251 A | 10/1998 | Bruce et al. | |
| 5,835,935 A | 11/1998 | Estakhri et al. | |
| 5,841,699 A | 11/1998 | Miyauchi | |
| 5,851,881 A | 12/1998 | Lin et al. | |
| 5,860,124 A | 1/1999 | Matthews et al. | |
| 5,887,145 A | 3/1999 | Harari et al. | |
| 5,928,370 A | 7/1999 | Asnaashari | |
| 5,930,167 A | 7/1999 | Lee et al. | |
| 5,930,815 A | 7/1999 | Estakhri et al. | |
| 6,028,794 A | 2/2000 | Nakai et al. | |
| 6,046,935 A | 4/2000 | Takeuchi et al. | |
| 6,076,137 A | 6/2000 | Asnaashari | |
| 6,081,447 A | 6/2000 | Lofgren et al. | |
| 6,103,573 A | 8/2000 | Harari et al. | |
| 6,128,695 A | 10/2000 | Estakhri et al. | |
| 6,134,143 A | 10/2000 | Norman | |
| 6,149,316 A | 11/2000 | Harari et al. | |
| 6,151,248 A | 11/2000 | Harari et al. | |
| 6,202,138 B1 | 3/2001 | Estakhri et al. | |
| 6,222,762 B1 | 4/2001 | Guterman et al. | |
| 6,230,233 B1 | 5/2001 | Lofgren et al. | |
| 6,281,075 B1 | 8/2001 | Yuan et al. | |
| 6,307,785 B1 * | 10/2001 | Takeuchi et al. | 365/185.23 |
| 6,335,878 B1 * | 1/2002 | Yamada et al. | 365/185.03 |
| 6,426,893 B1 | 7/2002 | Conley et al. | |
| 6,438,036 B2 * | 8/2002 | Seki et al. | 365/185.22 |
| 6,456,528 B1 | 9/2002 | Chen | |
| 6,512,263 B1 | 1/2003 | Yuan et al. | |
| 6,522,580 B2 | 2/2003 | Chen et al. | |
| 6,567,302 B2 * | 5/2003 | Lakhani | 365/185.03 |
| 6,603,680 B2 * | 8/2003 | Kanamitsu et al. | 365/185.03 |
| 6,614,070 B1 * | 9/2003 | Hirose et al. | 257/316 |
| 6,684,289 B1 | 1/2004 | Gonzalez et al. | |
| 6,721,843 B1 | 4/2004 | Estakhri | |
| 6,829,167 B2 | 12/2004 | Tu et al. | |
| 6,944,063 B2 * | 9/2005 | Chen et al. | 365/185.33 |
| 6,944,068 B2 * | 9/2005 | Quader et al. | 365/185.22 |
| 7,085,161 B2 * | 8/2006 | Chen et al. | 365/185.17 |
| 2002/0141237 A1 | 10/2002 | Goda et al. | |
| 2002/0172227 A1 | 11/2002 | Varelas et al. | |
| 2003/0002348 A1 | 1/2003 | Chen et al. | |
| 2003/0041210 A1 | 2/2003 | Keays | |
| 2004/0047182 A1 | 3/2004 | Cernea et al. | |
| 2004/0080995 A1 | 4/2004 | Mokhlesi | |
| 2004/0083405 A1 | 4/2004 | Chang et al. | |
| 2004/0228197 A1 | 11/2004 | Mokhlesi | |
| 2005/0018482 A1 | 1/2005 | Cernea et al. | |
| 2005/0018527 A1 | 1/2005 | Gorobets | |

FOREIGN PATENT DOCUMENTS

| | | |
|---|---|---|
| WO | WO 98/24028 A1 | 6/1998 |
| WO | WO 02/49039 A2 | 6/2002 |
| WO | 02/058074 A2 | 7/2002 |

OTHER PUBLICATIONS

Brown et al., "Nonvolatile Semiconductor Memory Technology," IEEE Press, Section 1.2, 1998, pp. 9-25.

Chan et al., "A True Single-Transistor Oxide-Nitride-Oxide EEPROM Device," IEEE Electron Device Letters, vol. EDL-8, No. 3, Mar. 1987, pp. 93-95.

Nozaki et al., "A 1-Mb EEPROM With MONOS Memory Cell for Semiconductor Disk Application," IEEE Journal of Solid-State Circuits, vol. 26, No. 4, Apr. 1991, pp. 497-501.

Eitan et al., "NROM: A Novel Localized Trapping, 2-Bit Nonvolatile Memory Cell," IEEE Electron Device Letters, vol. 21, No. 11, Nov. 2000, pp. 543-545.

"Notification of Transmittal of the International Search Report or the Declaration", corresponding PCT application No. PCT/US03/40361, International Searching Authority, European Patent Office, Jan. 6, 2004, 7 pages.

European Patent Office, Examiner's First Substantive Report, mailed in related European Patent Application No. 03 815 779.8 on Nov. 21, 2005, 3 pages.

European Patent Office, "Communication Pursuant to Article 96(2) EPC," mailed in related European Patent Application No. 03 815 779.8—2210 on Jun. 29, 2006, 2 pages.

China State Intellectual Property Office, "First Office Action," corresponding Chinese Patent Application No. 200380109217.6, mailed on Feb. 15, 2008, 27 pages (translation included.).

* cited by examiner

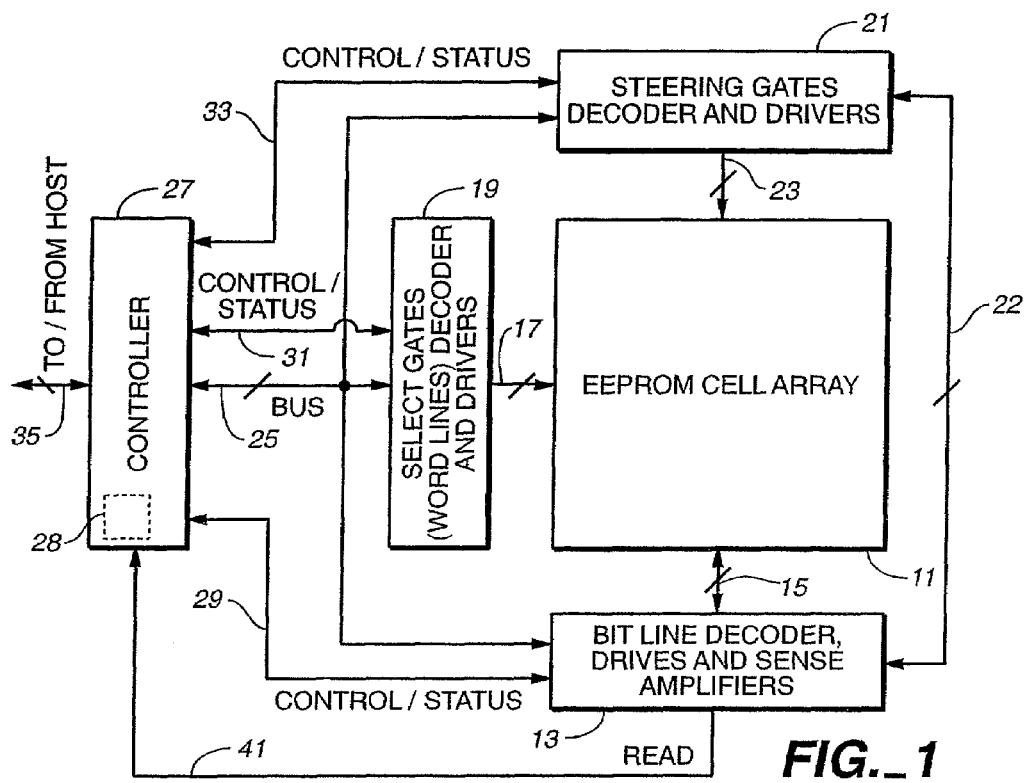
FIG._1
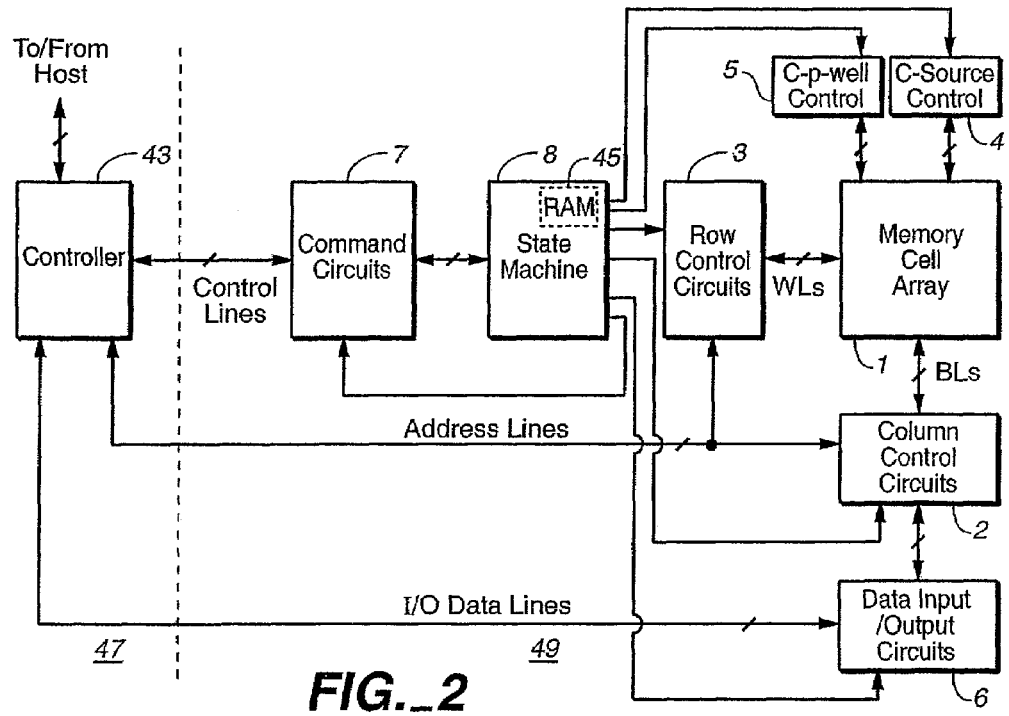
FIG._2

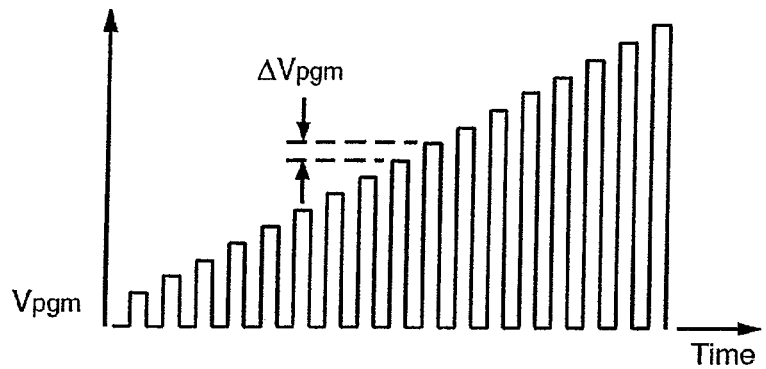
FIG._3
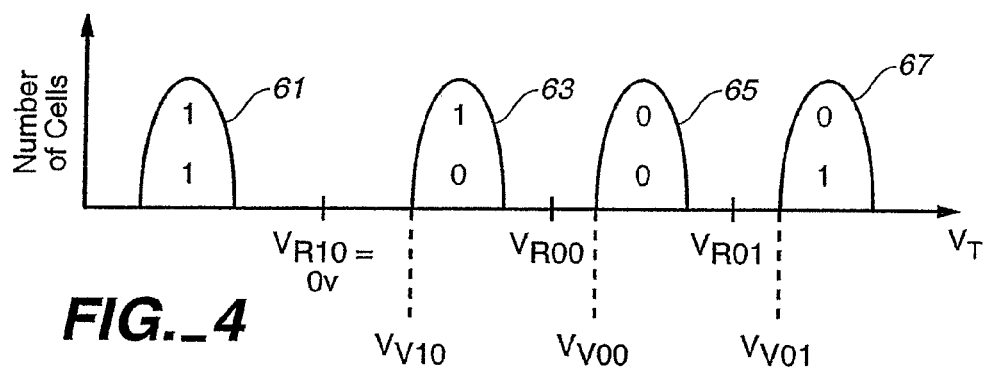
FIG._4
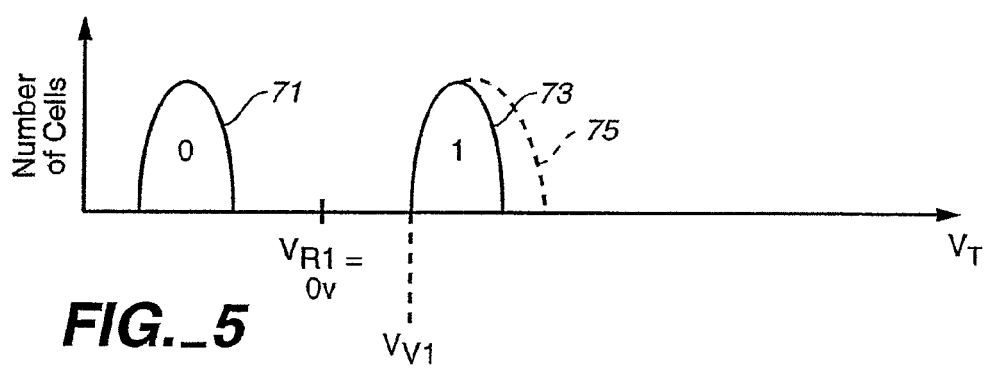
FIG._5
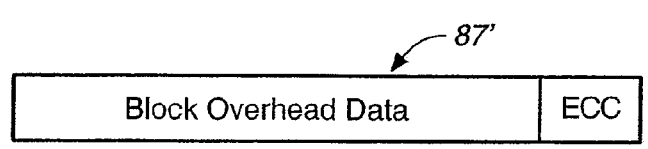
FIG._7

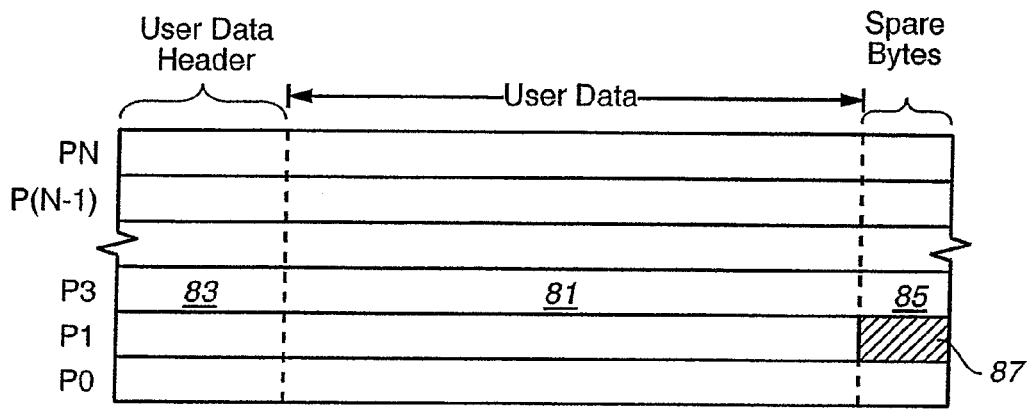
FIG._6
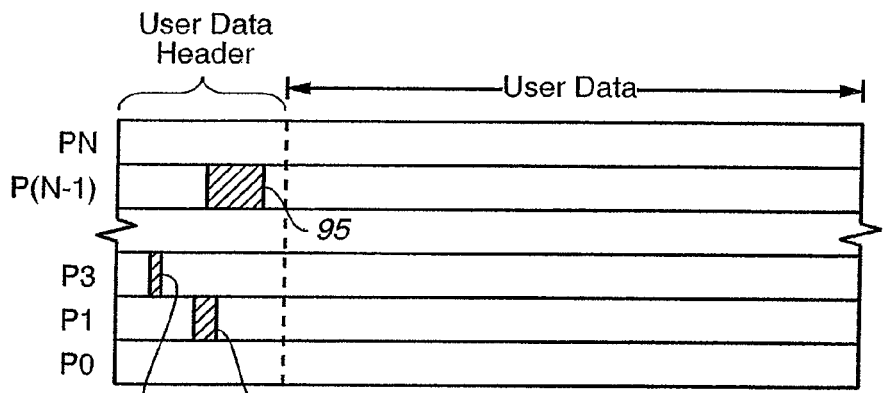
FIG._8
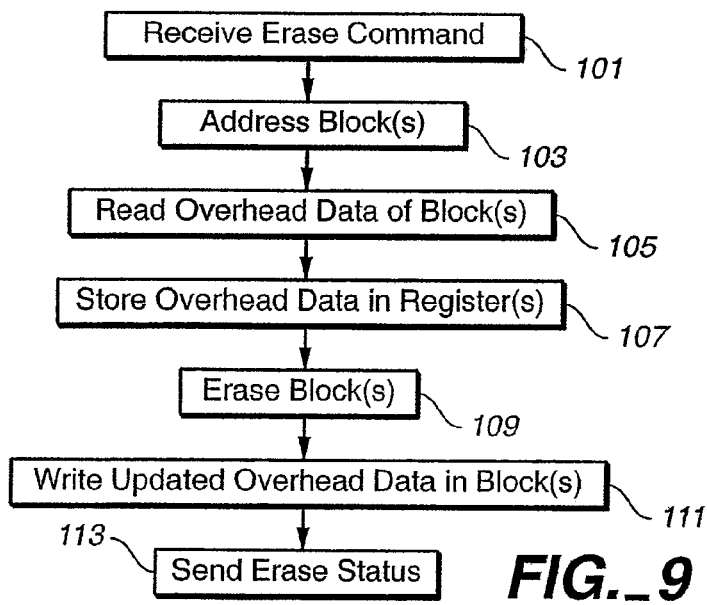
FIG._9

NON-VOLATILE SEMICONDUCTOR MEMORY WITH LARGE ERASE BLOCKS STORING CYCLE COUNTS

CROSS REFERENCE TO RELATED APPLICATIONS

This application is a continuation of application Ser. No. 11/003,046, filed on Dec. 2, 2004, now U.S. Pat. No. 7,085,161, which is a divisional of application Ser. No. 10/353,574, filed on Jan. 28, 2003, now U.S. Pat. No. 6,944,063, which applications are incorporated herein in their entirety by this reference.

FIELD OF THE INVENTION

This invention relates generally to non-volatile semiconductor memories and their operation, particularly to the use of memory cell block erase/write cycle counts.

BACKGROUND

There are many commercially successful non-volatile memory products being used today, particularly in the form of small form factor cards, which use an array of flash EEPROM (Electrically Erasable and Programmable Read Only Memory) cells.

NOR Array

In a typical NOR array, memory cells are connected between adjacent bit line source and drain diffusions that extend in a column direction with control gates connected to word lines extending along rows of cells. One typical memory cell has a "split-channel" between source and drain diffusions. A charge storage element of the cell is positioned over one portion of the channel and the word line (also referred to as a control gate) is positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. The word line extends over a row of charge storage elements. Examples of such cells, their uses in memory systems and methods of manufacturing them are given in U.S. Pat. Nos. 5,070,032, 5,095,344, 5,315,541, 5,343,063, and 5,661,053, and in co-pending U.S. patent application Ser. No. 09/239,073, filed Jan. 27, 1999, now U.S. Pat. No. 6,281,075.

A modification of this split-channel flash EEPROM cell adds a steering gate positioned between the charge storage element and the word line. Each steering gate of an array extends over one column of charge storage elements, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762.

There are various programming techniques for injecting electrons from the substrate onto a floating gate storage element through the gate dielectric. The most common programming mechanisms are described in a book edited by Brown and Brewer, *Nonvolatile Semiconductor Memory Technology*, IEEE Press, section 1.2, pages 9-25 (1998). One technique, termed channel "hot-electron injection" (section 1.2.3), injects electrons from the cell's channel into a region of the floating gate adjacent the cell's drain. Another technique, termed "source side injection" (section 1.2.4), controls the substrate surface electrical potential along the length of the memory cell channel in a manner to create conditions for electron injection in a region of the channel away from the drain. Source side injection is also described in an article by Kamiya et al., "EPROM Cell with High Gate Injection Efficiency," IEDM Technical Digest, 1982, pages 741-744, and in U.S. Pat. Nos. 4,622,656 and 5,313,421.

Two techniques for removing charge from charge storage elements to erase memory cells are used in both of the two types of NOR memory cell arrays described above. One is to erase to the substrate by applying appropriate voltages to the source, drain and other gate(s) that cause electrons to tunnel through a portion of a dielectric layer between the storage element and the substrate. The other erase technique is to transfer electrons from the storage element to another gate through a tunnel dielectric layer positioned between them. In the first type of cell described above, a third erase gate is provided for that purpose. In the second type of cell described above, which already has three gates because of the use of a steering gate, the charge storage element is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a storage element charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338.

Another type of memory cell includes two storage elements that may also be operated in multiple states on each storage element. In this type of cell, two storage elements are included over its channel between source and drain diffusions with a select transistor in between them. A steering gate is included along each column of storage elements and a word line is provided thereover along each row of storage elements.

When accessing a given storage element for reading or programming, the steering gate over the other storage element of the cell containing the storage element of interest is raised sufficiently high to turn on the channel under the other storage element no matter what charge level exists on it. This effectively eliminates the other storage element as a factor in reading or programming the storage element of interest in the same memory cell. For example, the amount of current flowing through the cell, which can be used to read its state, is then a function of the amount of charge on the storage element of interest but not of the other storage element in the same cell. Examples of this cell array architecture and operating techniques are described in U.S. Pat. Nos. 5,712,180, 6,103,573 and 6,151,248.

NAND Array

Another flash EEPROM architecture utilizes a NAND array, wherein series strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. An example of a NAND architecture array and its operation as part of a memory system is found in U.S. Pat. Nos. 5,570,315, 5,774,397 and 6,046,935.

Charge Storage Elements

The charge storage elements of current flash EEPROM arrays and discussed in the foregoing referenced patents and articles are most commonly electrically conductive floating gates, typically formed from doped polysilicon material. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

U.S. Pat. No. 5,851,881 describes the use of two storage elements positioned adjacent each other over the channel of the memory cell, one being such a dielectric element and the other a conductive floating gate. Two bits of data are stored, one in the dielectric element and the other in the floating gate. The memory cell is programmed into one of four different threshold level combinations, representing one of four storage states, by programming each of the two gates into one of two different charge level ranges.

Another approach to storing two bits in each cell utilizing a dielectric storage element has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric.

Large Erase Blocks

Memory cells of a typical non-volatile flash array are divided into discrete blocks of cells that are erased together. That is, the block is the erase unit. Each block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

Block Experience Counts

The number of erase and re-programming cycles experienced by the individual blocks of memory cells are often maintained as part of optimizing control of the operation of the memory system. One reason to do so is because of a limited number of erase/writing cycles that flash EEPROM cells can endure. Performance and reliability are usually degraded as the number of such cycles increases, and the amount of such degradation that can be tolerated depends upon various operating parameters of the system. Some memory cell blocks are typically cycled more often than others in normal operation. When the cycle count of a block reaches a pre-set limit of expected endurance, that block can be mapped out of the system in favor of a redundant block. An example of this is described in U.S. Pat. No. 5,268,870, wherein the experience count of each block is stored as part of the overhead data within the block. U.S. Pat. No. 6,426,893 describes a system that stores the block experience counts, as well as other overhead data, in blocks separate from the blocks to which they pertain. Further, the experience count can be used to even the usage (wear) of the memory cell blocks of a system. The relative block experience counts are monitored by the system controller and, in response to a predetermined unevenness of use being detected, changing the logical-to-physical address conversion of blocks in order to direct future high volume re-writes to blocks with lower experience cycle counts. Examples of such wear leveling techniques are given in U.S. Pat. No. 6,081,447. As an alternative to maintaining the experience counts in the blocks to which they pertain, they may be stored in other blocks provided for block overhead information. An example of this is described in U.S. patent application Ser. No. 09/505,555, filed Feb. 17, 2000, now U.S. Pat. No. 6,426,893. In addition to using the experience count for purposes of block substitution, the count can also be used by the controller to set voltages used during programming, reading and/or erase operations, since the optimum voltages will often increase as usage increases.

The patents, patent applications, articles and book portions identified above are all hereby expressly incorporated in their entirety into this Background by these references.

SUMMARY OF THE INVENTION

In a non-volatile memory system having its memory cells organized into blocks of simultaneously erasable cells, with the blocks further divided into multiple pages of user data that are individually programmable and readable, overhead data related to individual blocks are stored within the blocks to which the data pertains and updated as part of a cycle of erasing the block. If the cycle data is stored in spare cells of a single page of a block, it can then be read by a single read operation on that page. Alternatively, the cycle data may be spread over two or more pages of the block in unused cells, such as in headers of data sectors stored in the pages. These techniques have particular applicability to flash memory systems of the NAND type but may also be used to advantage in other types of non-volatile memory systems where blocks of memory cells are erased together.

As is a trend to increase the amount of data that a given number of memory cells can store, more than one bit of user data is preferably stored in each memory cell storage element by establishing more than two programmed states for each storage element. For the block cycle count data, however, there are advantages to storing that data in two states, or one bit per memory cell storage element. The cycle count data programming is improved and this programming may be done in a manner that reduces the amount of disturbs of the newly erased block into which it is written.

A redundancy code may be calculated from the cycle count data and then programmed with it as part of the block overhead data. An error correction code (ECC) is an example of such redundancy that may be provided in order to be able to correct some errors in the cycle count data and, if there are too many errors to correct, establish that the cycle count data is invalid. When invalid, the block is mapped out of the system because the number of erase cycles that it has experienced is unknown, and this uncertainty can adversely affect decisions that are made by the memory controller in operation of the block. A block may also be mapped out of the system in the event that the cycle count data is lost during an erase operation, such as can occur when power is lost during a time that the count is temporarily being stored in volatile memory. This can occur, for example, if, during an erase cycle, a user unplugs a memory card from a host system that is providing power.

The present invention operates on any of many different types of non-volatile memory, including the flash EEPROM systems described above in the Background and others. A particular NOR array structure using floating gate charge storage elements is described in U.S. patent applications Ser. No. 09/925,102, filed Aug. 8, 2001, now U.S. Pat. No. 6,762,092, and Ser. No. 09/667,344, filed Sep. 22, 2000, now U.S. Pat. No. 6,512,263. Flash memory arrays using dielectric charge storage elements are described in U.S. patent application Ser. No. 10/280,352, filed Oct. 25, 2002. The management of large memory cell erase blocks is described in U.S. patent applications Ser. No. 09/718,802, filed Nov. 22, 2000, now U.S. Pat. No. 6,684,289, and Ser. No. 09/766,436, filed Jan. 19, 2001, now U.S. Pat. No. 6,763,424. The programming of NAND arrays is described in applications Ser. No. 09/893,277, filed Jun. 27, 2001, now U.S. Pat. No. 6,522,580 and U.S. Pat. No. 6,456,528. The foregoing applications and patent are expressly incorporated in their entirety into this Summary by these references.

Additional goals, features and advantages of the various aspects of the present invention are included in the following description of representative embodiments, which description should be taken in conjunction with the accompanying drawings.

BRIEF DESCRIPTION OF THE DRAWINGS

FIG. 1 is a block diagram of a first non-volatile memory system in which the present invention may be implemented;

FIG. 2 is a block diagram of a second non-volatile memory system in which the present invention may be implemented;

FIG. 3 illustrates a voltage waveform that may be used to program data into either of the memory systems of FIG. 1 or FIG. 2;

FIG. 4 illustrates a distribution of voltage thresholds of a group of non-volatile memory cells that have been individually programmed into one of four states;

FIG. 5 illustrates a distribution of voltage thresholds of a group of non-volatile memory cells that have been individually programmed into one of two states;

FIG. 6 shows a first example organization of a block of memory cells to include multiple pages;

FIG. 7 illustrates block overhead data that may be stored in blocks of the type illustrated in FIG. 6;

FIG. 8 shows a second example organization of a block of memory cells to include multiple pages; and FIG. 9 is a flow chart showing an exemplary erase operation of either of the memory systems of FIG. 1 or 2 when storing block overhead data.

DESCRIPTION OF REPRESENTATIVE EMBODIMENTS

An example memory system in which the various aspects of the present invention may be implemented is illustrated by the block diagram of FIG. 1. A large number of individually addressable memory cells 11 are arranged in a regular array of rows and columns, although other physical arrangements of cells are certainly possible. This system is particularly adapted for the array 11 to be the NOR type, as described above in the Background and in references incorporated herein. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21. The controller includes various types of registers and other memory including a volatile random-access-memory (RAM) 28.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash™ Association, the MMC™ Association, and others. When in a card format, the lines 35 terminate in a connector on the card that interfaces with a complementary connector of the host device. The electrical interface of many cards follows the ATA standard, wherein the memory system appears to the host as if it was a magnetic disk drive. Other memory card interface standards also exist. As an alternative to the card format, a memory system of the type shown in FIG. 1 may be permanently embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

Operation of a memory system such as illustrated in FIG. 1 is further described in patents and articles identified in the NOR Array section of the Background above, and in other patents assigned to SanDisk Corporation, assignee of the present application. In addition, U.S. patent application Ser. No. 09/793,370, filed Feb. 26, 2001, now U.S. Pat. No. 6,738,289, describes a data programming method, which application is incorporated herein by this reference.

Another example memory system in which the various aspects of the present invention may be implemented is illustrated by the block diagram of FIG. 2. Memory cell array 1 including a plurality of memory cells M arranged in a matrix is controlled by a column control circuit 2, a row control circuit 3, a c-source control circuit 4 and a c-p-well control circuit 5. The memory cell array 1 may be of the NAND type that is described above in the Background and in references incorporated herein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 2) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 43. The controller 43 includes various types of registers and other memory, typically volatile random-access-memory.

Command data for controlling the flash memory device are inputted to command circuits 7 connected to external control lines that are connected with the controller 43. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL. The state machine 8 also includes a number of registers and other volatile random-access-memory 45.

The controller 43 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 47 that includes the controller 43, and one or more integrated circuit chips 49 that each contain a memory array and associated control, input/output and state machine circuits. The trend, of course, is to integrate the memory array and controller circuits of a system together on one or more integrated circuit chips.

Either of the memory systems of FIGS. 1 and 2 may be embedded as part of the host system, or may be included in a memory card that is removably insertable into a mating socket of a host system. Such a card may include the entire memory system, or the controller and memory array, with associated peripheral circuits, may be provided in separate cards. Several card implementations are described, for example, in U.S. Pat. No. 5,887,145, which patent is expressly incorporated herein in its entirety by this reference.

FIG. 3 illustrates a pulse technique for incrementally programming storage elements of either of the memory cell arrays 1 or 11. A programming voltage Vpgm waveform is illustrated. The programming voltage Vpgm is divided into many pulses, and increased $\Delta$Vpgm pulse by pulse. In periods between the pluses, the verify (read) operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, Vpgm is removed by raising the voltage of a bit or control line to which the series cell unit of the given cell is connected from 0V to Vdd. Programming of others of the cells being programmed in parallel continues until they in turn reach their verify levels. The threshold voltage moves from below the verify level to above it during the cell's last programming pulse.

FIG. 4 illustrates a technique of programming a memory cell array with four states per storage element. Two bits of data are thus stored in each storage element. The programmed storage elements form memory cell transistors with threshold levels ($V_T$) that fall into one of threshold distributions 61, 63, 65 or 67. The distribution 61 represents the erased state and is also one of the programmed states, "11" in this example. The distribution 61 includes cells having a negative threshold voltage $V_T$. The distribution 63, including positive threshold voltages, represents data bits "10". Similarly, the distribution 65 represents "00" and the distribution 67 represents "01". An additional number of states, and thus more bits, may be programmed into each storage element but a four state system has been chosen for illustration.

The individual cells are programmed by a series of pulses such as illustrated in FIG. 3. After a block has been erased, all of its memory cell storage transistors have threshold voltages within the distribution 61. Upon programming either user data or block overhead data into a number of memory cells forming all or a portion of a block, programming voltage pulses are applied to those cells whose state is to be changed from "11" to something else. For those transistors to be programmed into the first state "10" out of erase, the pulsing is terminated when their $V_T$ become equal to or greater than the verify level $V_{V10}$, within the distribution 63. The states of the cells are verified in between the programming pulses. Similarly, pulsing is terminated for those storage transistors to be programmed into the "00" state when their $V_T$ become equal to or greater than the verify level $V_{V00}$, within the distribution 65. Finally, for those storage element transistors being programmed into the "01" state, the program pulses are terminated when their $V_T$ reaches their verify level $V_{V01}$, within the distribution 67. At that point, the parallel programming of the group of the memory cells has been completed.

The individual program verify levels $V_{V10}$, $V_{V00}$ and $V_{V01}$ are coincident with the lower extremes of their respective distributions 63, 65 and 67. The beginning voltage of the programming pulses of FIG. 3 may be around 12 volts, as an example, and the increment between pulses ΔVpgm about 0.2 volt, for typical programming. The spread of the individual distributions 61, 63, 65 and 67 is approximately equal to ΔVpgm.

FIG. 4 also illustrates the voltages used to read data from individual cells by determining which of the four threshold states the cell has been programmed. The voltages $V_{R10}$, $V_{R00}$ and $V_{R01}$ are reference voltages used to read the "10", "00" and "01" storage states, respectively. These voltages are positioned roughly halfway between adjacent ones of the distributions 61, 63, 65 and 67. These are the threshold voltages with which the threshold voltage state of each memory cell transistor being read is compared. This is accomplished by comparing a current or voltage measured from the cell with reference currents or voltages, respectively.

It is often desirable, in a four or more storage state system, to be able to program some cells into one of two states (binary). The use of both multi-state and binary programming in a single array are described in U.S. Pat. No. 5,930,167, which patent is incorporated in its entirety by this reference, and aforementioned U.S. application Ser. No. 09/956,340, now U.S. Pat. No. 6,456,528. Another form of such dual programming that minimizes programming voltages, and thus which minimizes disturbs of the programmed or erased states of other memory cells, is illustrated in FIG. 5. An erased state "0" is also one of the two programmed states, illustrated by a programmed distribution 71. The second programmed state "1" is represented by a distribution 73. Programming into the "1" state is accomplished by use of the verify level $V_{V1}$. Data are read from the two-state memory cells of FIG. 5 by use of a reference level $V_{R1}$ at zero volts $V_T$. The distributions 71 and 73 of FIG. 5 correspond respectively to the distributions 61 and 63 of FIG. 4. By avoiding the higher threshold level distributions 65 and 67 in the binary case, disturbs to the erased or programmed states of other cells as a result of programming cells in binary are minimized.

FIG. 6 shows the organization of an example one of a large number of individually addressable blocks of memory cells in a typical system. The block of memory cells, the unit of erase, is divided into a number of pages P0 through PN. The number N of pages in a block can be 8, 16 or 32, as examples. Each single page is the unit of programming and reading. One or more host sectors of data are stored as user data in each page. Physically, a page may be formed of a single row of memory cells within either of the arrays 1 or 11 of the systems of FIGS. 1 and 2. A page P3 of FIG. 6, for example, includes space 81 for the user data and space 83 for a header of overhead data related to the user data. An ECC calculated from the user data stored in memory space 81 is stored in the space 83, for example. Some memory arrays also include a few spare bytes of storage capacity in a space 85 to replace any bad bytes within the user space 81.

It is these spare bytes of one page of the block that are used to store overhead information data of the entire block. Block overhead data 87 is shown, for example, to be part of the page P1. An important piece of information stored as part of the data 87 is often a count of the number of times that the block in which the data 87 is stored has been erased. Alternatively, some other indication of the number of erase cycles experienced by the block may be stored. This data is useful for managing operation of the array. Other block overhead data 87 that can be useful include optimal erase, programming and/or reading voltages for the block memory cells, flags to indicate the status of the block, logical and/or physical addresses of the block and any substitute block, and the like. The block overhead data 87 provides information of the physical block itself, while the page overhead data 83 provides information of the user data stored in its same page. Although either or both of these types of overhead data may be stored in a block(s) different from the block to which they pertain, the storage locations shown in FIG. 6 are preferred for most applications.

The user data is preferably stored in the memory cells of each page in multi-state; that is, each floating gate or other storage element of the memory cells is programmed into one of more than two states in order to store more than one bit of data in each storage element. The example 'shown in FIG. 4, wherein the individual storage elements are programmed into one of four states, is conveniently implemented. This reduces the number of memory cells required to store a given amount of data. It is often preferable, however, to program the block overhead data in the group of cells 87 in binary; that is, each floating gate or other storage element of the memory cells is programmed into one of exactly two states. The example shown in FIG. 5 can be used. Although this takes more memory cells to store the block overhead than if done in multi-state, the penalty is small because the amount of data is small. The advantages include the ability to program the block overhead data in a reduced amount of time, with a reduced sensitivity to disturbs and field coupling effects, and with less disturbing effect upon the erased or programmed state of other memory cells in the same or adjacent blocks.

Although binary programming of the block overhead data is preferably accomplished by the use of successive programming pulses and intervening state verifications as discussed above with respect to FIG. 3, the time necessary to carry out a programming process can be significantly reduced by increasing the magnitude of the starting pulse and/or by increasing the size of the steps ΔVpgm. If ΔVpgm is a value of 0.2 volt for programming user data in multi-state, a higher value, such as 0.4 volt, can be used for programming the block overhead data in binary. The increased ΔVpgm results in the programmed cell distribution 73 of FIG. 5 spreading as indicated by 75. But since there are no other programmed states higher than the state 73, this increased distribution width poses no problem.

In general, the block overhead data can be stored in the spare cells of any one of the pages within the example block of FIG. 6. The page within each block in which the block overhead data is stored can either be fixed or allowed to vary from block-to-block and over time. For example, if the page PI requires use of some of its spare cells to replace defective cells, and if there are not then enough spare cells remaining to store the block overhead data, the overhead data for that block can be stored in another page. Further, the space for the block overhead data need not necessarily be at the end of a page or its memory cell row as illustrated in FIG. 6 but rather can be in some other location where unused memory cells exist. In addition, the block overhead data need not necessarily be stored in contiguously positioned memory cells, although it is likely easier for the memory controller if the data are stored in successive cell address locations.

If the memory array is of a NAND type, there can be some pages that are preferred over others for storing the block overhead data. In one type of NAND flash memory discussed in patents referenced in the Background above, the pages are constrained to be programmed in a particular order, such as P0 through PN, to reduce disturbing effects of programming one page on the programmed states of cells of other pages. Further, the last pages PN and P(N-1) tend to be more susceptible to disturbing influences than others of the pages. Therefore, it is preferable to store the block overhead data in some other page nearer to the beginning of the block, such as P4 or P5 of blocks having 16 pages total.

Because the block overhead data can be important to the operation of the memory, a redundancy code such as an ECC may be calculated from the block overhead data and stored with that data in the same block. The ECC is then used to verify the data when it is read, and to provide an ability to correct a few invalid bits. The organization of the block overhead data 87 of FIG. 6 to include an ECC is shown in FIG. 7. If the number of invalid bits of the stored block overhead data is in excess of what the ECC can correct, that information is useful to the controller. If the type of overhead data being stored is important to the operation of the memory system, then the inability to read that data from a block will be used by the controller to map out that block so that it is not used again. A flag may be set within the block to indicate that it is not to be used, or the controller can independently keep a list of invalid blocks.

A memory cell block arrangement different from FIG. 6 is shown in FIG. 8, in order to provide another implementation. In this case, spare cells are not included in each page. The block overhead data, therefore, needs to be stored elsewhere within the block. The example shown in FIG. 8 distributes this data in spare bytes within page headers of the block, such as in locations 91, 93 and 95 of three different page headers. This then requires that all three pages be read before the block overhead data can be obtained, contrasted with needing to read only one page of a block in the example of FIG. 6.

With reference to FIG. 9, an exemplary erase operation is explained that utilizes the block overhead data described above. In a first step 101, a command is issued by the controller (27 of FIG. 1 or 43 of FIG. 2) to simultaneously erase a number of one or more blocks specified by addresses issued in a step 103. In a next step 105, the controller reads the block overhead data from each of the addressed blocks. In a usual system, this involves reading the entire page(s) of each addressed block in which their block overhead data is stored since the page is the unit of programming and erasing. The overhead data can be, for example, the data 87 of FIG. 6 or the data 91, 93, 95 of FIG. 8. If the block overhead data is stored in a different number of states than the user data and their headers, then the controller reads the overhead data with a different set of reference levels than are used when reading the user data and headers. This read data is then temporarily stored in the system by the controller, most conveniently in random-access-memory (RAM) 28 or 45 that is included as part of the respective controller 27 and state machine 8. The memory cells in each of the addressed blocks are then erased together, per step 109.

If the block overhead data are stored along with an ECC or other redundancy code calculated from the data, the validity of the data is then checked before writing it into the RAM. If determined to be valid, or if erroneous overhead data can be corrected to make it valid, the process proceeds as described. However, if the block overhead data are not, or cannot be made to be, valid, then it may be desired to take the block out of service because of a concern that the block cannot in the future be operated properly when its history is not known. The erase process may then be stopped with respect to that block and its address added to a bad block list maintained by the controller. Alternatively, the erase process may continue and a flag written into the overhead space of the block to indicate that it is no longer to be used. The controller then looks for such flags when determining the blocks to be subjected to future erase and programming cycles.

Additionally, if the power supply to the memory system is interrupted after the addressed blocks have been erased, the block overhead data will be lost if the RAM in which the data is temporarily stored in volatile memory, which is usually the case. In this situation, the controller, once power is restored, has no block overhead data to write back into the erased blocks. Any future attempts to use the blocks that involve reading the block overhead data, when such data do not exist, can cause the controller to then map the blocks out of the system by adding their addresses to the bad block list, setting a flag in the blocks, or by some other technique.

As discussed above, an important piece of block overhead data can be the number of times the individual block has experienced an erase and re-programming cycle. This number, or some quantity related to that number, if included, is then updated as part of the erase cycle. The quantity stored in the controller RAM is read from RAM and updated for each block being erased to record that the block has been subjected to another erase cycle. As indicated by a step 111 of FIG. 9, the updated number is written back into each block to which it pertains. The simplest implementation is to increment the erase cycle count read from the block by one, and then write that incremented count back into the block after it has been erased. The block overhead data may also include other information data that is not updated each time the block is erased, in which case this type of data is written back into the erased block without any change. If an ECC or other redundancy code is used with the block overhead data, such a code is calculated from the updated overhead data to be written back into the block and then programmed along with the updated overhead data into the block.

A last step of the erase cycle is for the array and its peripheral circuits to send a completion status signal back to the controller, as indicated in step 113. The erased blocks remain erased except in the location(s) where the block overhead data are programmed.m User data may thereafter be programmed into the pages of the block.

The erase cycle count can be used in a number of different ways. Since certain characteristics of the memory cells change as their number of erase/programming cycles increases, operation of the array is optimized if affected operating parameters are also changed. Examples of such operating parameters include erase and programming voltages, and the frequency that user data within the blocks are refreshed to bring charge levels back within optimal ranges. Blocks with low cycle counts can be operated with lower programming and erase voltages, thereby to extend their useful life. Data refreshing can affect performance if it occurs too often, so blocks with low cycle counts are not refreshed as often as those with high cycle counts. The cycle count can also be utilized to even out the usage (wear) of the individual blocks by altering a logical-to-physical block address table when differences in usage of various blocks exceeds some pre-set limits. Additionally, if any blocks experience a number of cycles that exceeds their expected useful lifetime, those blocks can be permanently mapped out of the system.

Although the present invention has been described with respect to specific embodiments, it will be understood that the invention is entitled to protection within the full scope of the appended claims.

The invention claimed is:

1. A method of operating a non-volatile memory having an array of memory cells organized into blocks of cells with storage elements that are erasable together as a unit into a first threshold range and which individually store a plurality of pages of user data in the first threshold range and in at least second, third and fourth threshold ranges that are successively larger than the first threshold range, comprising:
   (a) storing (1) data of the number of times the blocks have been cycled and (2) a redundancy code calculated from the cycle data, the cycle data and redundancy code being stored within a given number of memory cells of the blocks to which the cycle data pertain,
   (b) an erase operation, including,
   addressing one or more of the blocks for erase,
   reading the cycle data from each of said one or more blocks and temporarily storing the read cycle data, including reading the redundancy code calculated from and stored with the cycle data and checking the read cycle data against the read redundancy code,
   erasing the memory cells within said one or more blocks unless checking the read cycle data against the read redundancy code reveals that the cycle data is invalid, in which case the block in which the read cycle data and redundancy code reside is marked as unusable,
   unless checking the read cycle data against the read redundancy code reveals that the cycle data is invalid, updating the read cycle data, and
   unless checking the read cycle data against the read redundancy code reveals that the cycle data is invalid, programming the updated read cycle data back into respective ones of said one or more blocks by driving the threshold levels of their at least some of given number of cells from the first to the second threshold ranges without use of the third or fourth threshold range, thereby to leave the pages within the one or more blocks available for programming user data therein, wherein programming the updated cycle data includes calculating a redundancy code from the updated cycle data and storing the calculated redundancy code in the same block as the cycle data, and
   (c) thereafter programming user data into pages of said one or more blocks by using at least said first, second, third and fourth threshold ranges.

2. The method of claim 1, wherein the updated cycle data is programmed into spare cells of a single page of the respective ones of said one or more blocks.

3. The method of claim 1, wherein, in a case where the cycle data is lost prior to either updating the cycle data or programming the updated cycle data back into said one or more blocks, marking said one or more blocks as unusable instead of programming user data into pages of said one or more blocks.

4. The method of claim 1, wherein said at least first, second, third and fourth threshold ranges are successively larger than each other, and wherein the updated read cycle data are programmed into the first and second threshold ranges without use of the third and fourth threshold ranges.

5. The method of claim 1, wherein the non-volatile memory being operated has the array of memory cells connected in a NAND arrangement.

6. The method of claim 2, wherein the non-volatile memory being operated has the array of memory cells connected in a NAND arrangement.

* * * * *